United States Patent
Koontz (10) Patent No.: US 7,279,406 B2
(45) Date of Patent: Oct. 9, 2007

(54) TAILORING CHANNEL STRAIN PROFILE BY RECESSED MATERIAL COMPOSITION CONTROL

(75) Inventor: Elisabeth Marley Koontz, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 92 days.

(21) Appl. No.: 11/021,649

(22) Filed: Dec. 22, 2004

(65) Prior Publication Data

US 2006/0134873 A1    Jun. 22, 2006

(51) Int. Cl.
*H01L 21/3205* (2006.01)
*H01L 21/4763* (2006.01)

(52) U.S. Cl. .............. 438/589; 257/E21.633; 257/E21.634; 438/301

(58) Field of Classification Search ............... 438/589, 438/301; 257/E21.633, E21.634
See application file for complete search history.

(56) References Cited

U.S. PATENT DOCUMENTS

| 6,673,694 | B2 | 1/2004 | Borenstein |
| 6,753,555 | B2 | 6/2004 | Takagi et al. |
| 6,774,409 | B2 | 8/2004 | Baba et al. |
| 6,787,793 | B2 | 9/2004 | Yoshida |
| 6,806,151 | B2 | 10/2004 | Wasshuber et al. |
| 7,026,232 | B1 * | 4/2006 | Koontz et al. ............. 438/589 |
| 2003/0080361 | A1 * | 5/2003 | Murthy et al. ............. 257/288 |
| 2004/0173790 | A1 | 9/2004 | Yeo et al. |
| 2004/0173815 | A1 | 9/2004 | Yeo et al. |
| 2004/0188760 | A1 | 9/2004 | Skotnicki et al. |

* cited by examiner

*Primary Examiner*—Asok Kumar Sarkar
(74) *Attorney, Agent, or Firm*—Peter K. McLarty; W. James Brady, III; Frederick J. Telecky, Jr.

(57) ABSTRACT

The present invention facilitates semiconductor fabrication by providing methods of fabrication that tailor applied strain profiles to channel regions of transistor devices. A strain profile is selected for the channel regions (104). Recessed regions are formed (106) in active regions of a semiconductor device after formation of gate structures according to the selected strain profile. A recess etch (106) is employed to remove a surface portion of the active regions thereby forming the recess regions. Subsequently, a composition controlled recess structure is formed (108) within the recessed regions according to the selected strain profile. The recess structure is comprised of a strain inducing material, wherein one or more of its components are controlled and/or adjusted during formation (108) to tailor the applied vertical channel strain profile.

20 Claims, 9 Drawing Sheets

TAILORING CHANNEL STRAIN PROFILE BY RECESSED MATERIAL COMPOSITION CONTROL

FIELD OF INVENTION

The present invention relates generally to semiconductor devices and more particularly to transistors and associated methods of manufacture having improved mobility due to channel strain.

BACKGROUND OF THE INVENTION

A conventional MOS transistor generally includes a semiconductor substrate, such as silicon, having a source, a drain, and a channel positioned between the source and drain. A gate stack composed of a conductive material (a gate conductor), an oxide layer (a gate oxide), and sidewall spacers, is typically located above the channel. The gate oxide is typically located directly above the channel, while the gate conductor, generally comprised of polycrystalline silicon (polysilicon) material, is located above the gate oxide. The sidewall spacers protect the sidewalls of the gate conductor.

Generally, for a given electric field across the channel of a MOS transistor, the amount of current that flows through the channel is directly proportional to the mobility of carriers in the channel. Thus the higher the mobility of the carriers in the channel, the more rapidly the carriers will pass through the channel and the faster a circuit can perform when using high mobility MOS transistors. Additionally, improving the mobility of the carriers in the channel can allow device operation at lower voltages.

A number of techniques can be employed to improve mobility of the carriers in the channel. One technique is to reduce the channel length and/or the thickness of the gate oxide thereby shortening the distances carriers must travel and increasing current drive and switching performance. However, reducing the thickness of the gate oxide results in an increase in gate tunneling current, which in turn degrades the performance of the device by increasing off state leakage. Furthermore, decreasing the thickness of the gate oxide and/or the channel length requires more advanced and expensive lithography technology.

Another technique to increase the mobility of the carriers in the channel of an MOS transistor is to produce a mechanical stress or strain in the channel. A compressive strained channel typically provides hole mobility enhancement, which is particularly beneficial for PMOS devices, whereas a tensile strained channel typically provides electron mobility enhancement, which is particularly beneficial for NMOS devices. Generally, a layer is formed that has a lattice mismatch between the formed layer and underlying substrate and channel. The lattice mismatch then induces strain across a channel region.

One drawback to improving channel mobility via strain is that compressive strain, which generally improves hole mobility for silicon substrate devices, can degrade electron mobility and that tensile strain, which improves electron mobility for silicon substrate based devices, can also degrade hole mobility. As a result, introducing tensile strain can improve performance of NMOS devices but degrade performance of PMOS devices. Similarly, introducing compressive strain can improve performance of PMOS devices but degrade performance of NMOS devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates semiconductor device fabrication by tailoring a vertical channel strain profile by selecting and controlling composition of strain inducing materials. The vertical channel strain profile indicates an amount and type of strain induced vertically through channel regions of a device. By controlling the composition of formed strain inducing materials, such as silicon-carbon and silicon-germanium, the amount of strain induced vertically through the channel regions of a device can be controlled.

Generally, recessed regions are formed in active regions of a semiconductor device after formation of gate structures. A recess etch is employed to remove a surface portion of the active regions thereby forming the recess regions. Subsequently, a composition controlled recess structure is formed within the recessed regions. The recess structure is comprised of a strain inducing material, wherein one or more of its components are controlled and/or adjusted during formation to tailor the applied vertical channel strain profile.

The following description and annexed drawings set forth in detail certain illustrative aspects and implementations of the invention. These are indicative of but a few of the various ways in which the principles of the invention may be employed.

DETAILED DESCRIPTION OF THE INVENTION

One or more implementations of the present invention will now be described with reference to the attached drawings, wherein like reference numerals are used to refer to like elements throughout, and wherein the illustrated structures are not necessarily drawn to scale. The invention provides transistor structures and methods in which transistor mobility is improved.

The present invention facilitates semiconductor device fabrication by tailoring a vertical channel strain profile by selecting and controlling composition of strain inducing materials. The vertical channel strain profile indicates an amount/magnitude and type of strain induced vertically through channel regions of a device. By controlling the composition of formed strain inducing materials, such as silicon-carbon and silicon-germanium, the amount of strain induced vertically through the channel regions of a device can be controlled.

Recessed regions are formed in active regions of a semiconductor device after formation of gate structures by removing a surface portion of the active regions. Subsequently, a composition controlled recess structure is formed within the recessed regions. The recess structure is comprised of a strain inducing material, wherein one or more of its components are controlled and/or adjusted during formation to tailor the applied vertical channel strain profile.

Figure 1:
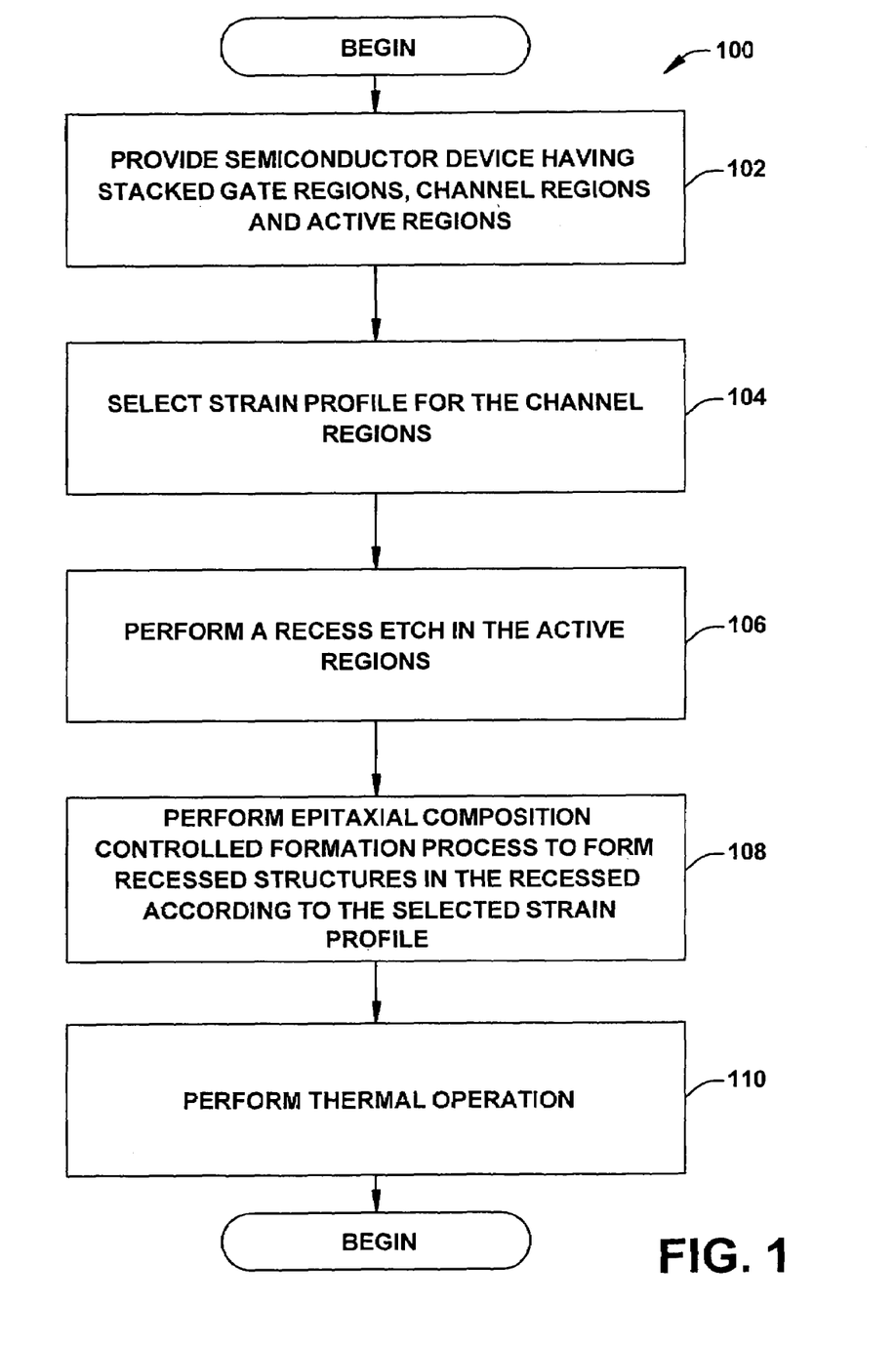
FIG. 1 is a flow diagram illustrating a method of fabricating a semiconductor device that applies tailored channel strain profiles to channel regions of transistor devices in accordance with an aspect of the present invention.

FIG. 1 is a flow diagram illustrating a method 100 of fabricating a semiconductor device that applies tailored channel strain profiles to channel regions of transistor devices located within NMOS and/or PMOS regions of a semiconductor device in accordance with an aspect of the present invention. The method identifies a selected and/or desired strain profile and controls composition of strain inducing material during formation of recessed structures.

The method 100 begins at block 102, wherein a semiconductor device having formed gate structures, defined channel regions, and defined active regions is provided. Typically, offset spacers adjacent the gate structures have been formed but source/drain region formation has not been completed. Sidewall spacers and/or extension regions may also be formed in a depth direction of the channel.

A strain profile is selected for the channel regions at block 104. The strain profile includes an amount and type of strain to be induced vertically through a central portion of the channel regions, as further described infra. The type of strain induced is typically uniaxial or biaxial, and tensile or compressive. However, the amount or magnitude of strain can be constant or vary linearly or non-linearly across the profile.

Continuing at block 106, a recess etch is performed on the active regions to from recess regions having a selected depth. Material from surfaces of the active regions is removed thereby forming recessed regions. The selected depth of the recess regions is selected, at least in part, according to the selected strain profile, particularly a length of the strain profile, and is obtained by controlling the recess etch process. A mask may be employed during recess region formation to cover portions of the semiconductor device, such as the gate structure that may remain masked and serve as a mask for the recess etch.

Subsequently, a composition controlled epitaxial growth and/or formation process is performed according to the selected strain profile to form recess structures in the active regions of the transistor devices and refill the recessed regions at block 108. The recess structures have different lattice constants than underlying semiconductor substrate, thereby inducing strain into the neighboring channel regions.

An exemplary mechanism for introducing tensile strain in the channel region is to form the recess structures in active regions comprised of a tensile strain producing material, such as silicon-carbon. An exemplary mechanism for introducing compressive strain in the channel region is to remove a selected amount of material from a surface portion of the active regions and subsequently re-depositing and forming recess structures in the active regions comprised of a compressive strain producing material, such as silicon-germanium. As described below, composition of the strain producing material is typically varied to attain the selected strain profile.

Typically, the recess structures overfill the recessed regions by an amount and can be doped with a suitable dopant, such as boron or phosphorous, during formation and/or by a subsequent implantation process. Composition of the recess structures can be varied vertically within the recess by, for example, adjusting gas flows during formation in order to achieve the selected strain profile. The composition of the recess structure may also account for a shape of the recessed regions and/or a shape of the formed recess structures in order to attain the selected strain profile. Generally, uniaxial or biaxial tensile strain promotes or improves electron mobility and is employed in NMOS devices to improve performance. Similarly, uniaxial or biaxial compressive strain promotes or improves hole mobility and is typically employed in PMOS devices to improve device performance.

Compressive strain is typically introduced into the channel regions by forming the recess structures comprised of silicon-germanium while tensile strain is typically introduced by forming recess structures comprised of silicon-carbon. However, it is appreciated that other suitable strain inducing compositions can be employed. As an example, the germanium content of silicon-germanium can be increased in order to increase the compressive strain and decreased in order to decrease the compressive strain applied to the channel region. As another example, the carbon content of silicon-carbon can be increased in order to increase the tensile strain and decreased in order to decrease the tensile strain applied to the channel region.

A thermal operation is performed at block 110 that activates dopants within the recess structures and the active regions that facilitates formation of source/drain regions. The thermal operation is typically an anneal process performed at a selected temperature for a selected duration.

It is noted that the method 100 can be applied to NMOS and/or PMOS devices. Thus, the method 100 can be applied to NMOS devices, but not PMOS devices, located on a single die. Conversely, the method 100 can be applied to PMOS device, but not NMOS devices, located on a single die. Furthermore, the method can be performed on groups or subsets of transistor devices of a particular device.

Figure 2A:
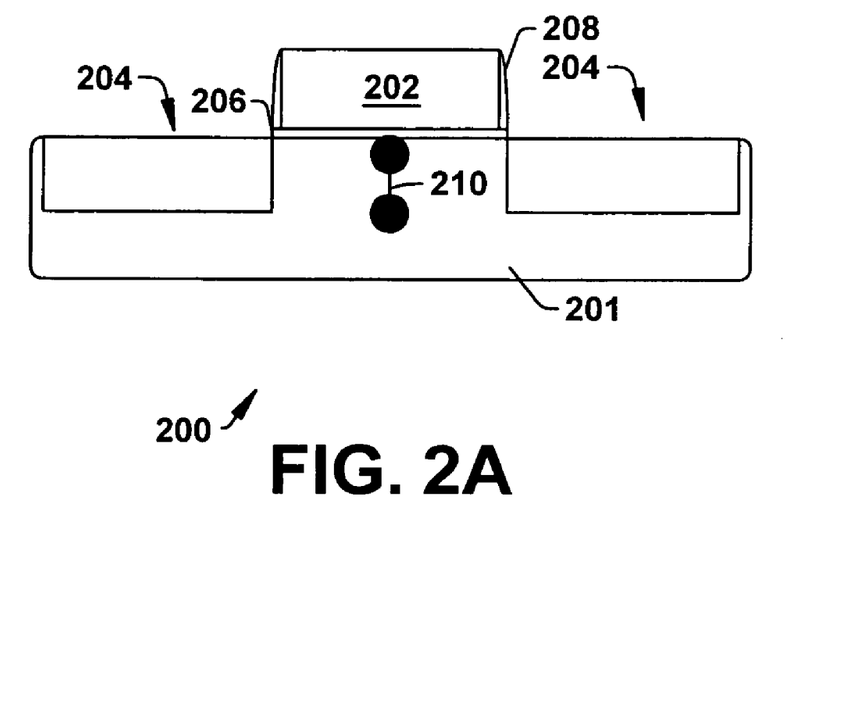
FIG. 2A is a diagram illustrating a conventional semiconductor transistor device 200 comprising conventional epitaxial filled structures.

FIG. 2A is a diagram illustrating a conventional semiconductor transistor device 200 comprising conventional epitaxial filled structures. The device 200 includes a polysilicon gate 202 formed over a semiconductor substrate 201 and defines a channel region below the polysilicon gate 202. A gate oxide 206 is formed on the semiconductor substrate 201 and below the polysilicon gate 202. Offset spacers 208 are formed on lateral sides of the polysilicon gate 202. Epitaxial filled structures 204 are formed in active regions by performing a recess etch and the filling recessed regions with a substantially uniform composition of a strain material. The filled structures 204 cause strain to be applied to the channel region resulting in a strain profile 210. If the filled structures 204 could be formed with perfect, 90 degree corners, the strain profile would be substantially constant from bottom to top. However, this substantially constant strain profile is not readily feasible since the sidewalls of recessed regions are rarely perfectly vertical at the time of strained material deposition; the recessed regions typically have more of a "U" shape profile, which results in a strain profile that is not constant.

Figure 2B:
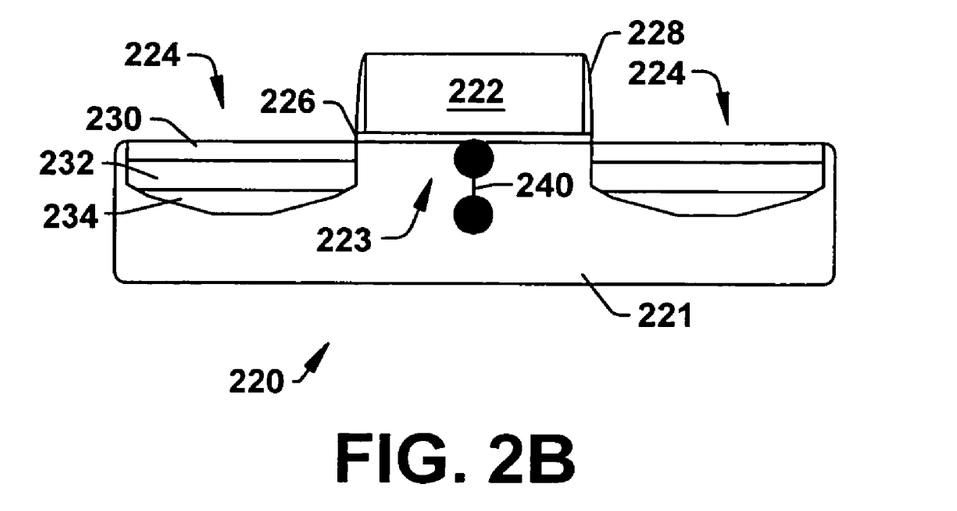
FIG. 2B is a diagram illustrating a semiconductor transistor device comprising composition controlled recess structures in accordance with an aspect of the present invention.

FIG. 2B is a diagram illustrating a semiconductor transistor device 220 comprising composition controlled recess structures 224 in accordance with an aspect of the present invention. The composition controlled recess structures 224 permit controlling a vertical strain profile 240 applied to a channel region 223 of the device 220.

A gate oxide 226 is formed on a semiconductor substrate 201 and gate electrode material 222 is formed on the gate oxide 226. Generally, the gate oxide 226 and the gate electrode material 222 are patterned to remove portions outside the channel region 223 of the device and thereby form a gate structure comprised of the gate oxide 226 and the gate electrodes 222. Offset spacers 228 are then formed on lateral edges of the gate electrodes 226. Lightly doped drain regions and/or extension regions can then be formed (not shown).

A recess etch is performed to remove surface portions of the semiconductor substrate 221 and form recessed regions having a selected depth. The recess regions are typically formed via dry etching, which is an anisotropic etch technique, resulting in very vertical sidewall profiles. The U-shape is the result of "mass transport" before the onset of either Si:C or SiGe epitaxy (at the temperatures required for growth, the Si atoms are mobile and will begin to move to their lowest energy state, which is a flat surface). Thus, the squared profile is smoothed to a U-shape profile. Subsequently, the recessed regions are filled by a composition controlled epitaxial layer formation process that forms filled recess structures 224 that have varying compositions of strain material at differing depths within the recesses. The filled structures 224 cause a type and varying amounts of strain, referred to as a vertical strain profile 240, to be induced/transferred to the channel region 223. Thus, the strain profile 240 attained is a function of the composition of the filled structures 224.

The filled structures 224 in the present example include a relatively high strain material 234, a moderate strain material 232, and a relatively low strain material 230. However, it is appreciated that the filled structures 224 can comprise other variations of strain material and be in accordance with the present invention. As an example of a suitable composition of the filled structures 224, silicon-germanium can be employed, which is a suitable exemplary strain material, wherein a relatively large atomic concentration of germanium is used for the high strain material 234, a moderate atomic concentration of germanium is used for the moderate strain material 232, and a relatively low atomic concentration of germanium is used for the relatively low strain material 230. The shape of the filled structures 224 and the strain applied by the material therein provides the vertical channel strain profile 240 as being substantially constant, in one example. It is appreciated that variations of the composition controlled recess structures 224 are contemplated by the present invention. The strain composition of the filled structures 224 can vary according to individual layers, vary linearly, or vary non-linearly. The resulting strain profile 240 can thus be controlled to be constant or non-constant, throughout a depth of the channel and, if non-constant, vary linearly or non-linearly.

One suitable technique to forming the filled structures 224 comprises selecting a depth of the recessed regions according to a length (or depth) of the strain profile 240. An initial concentration of strain material is selected according to a strain magnitude at a bottom of the strain profile 240 (at the bottom of the channel) and a final concentration is selected according to a strain magnitude at a top of the strain profile 240 (at the top of the channel). Then, the filled structures 224 can be formed starting with the initial concentration, ending with the final concentration, and varying the concentration according to the strain profile 240 in between the start and end points.

The compositions employed to produce desired strains can vary in accordance with the present invention. Further, the amount of strain deemed as high strain, medium strain, and low strain can vary according to the device being fabricated. Additionally, the compositions and strains produced by the compositions can vary according to devices employed in and/or other factors. As an example, for a typical transistor device, for SiGe, high strain could be produced with 25 percent Ge, medium strain produced with 15 percent Ge, and low strain produced with 5 percent Ge. Similarly, as an example for SiC, high strain could be produced with 1.6 percent C, medium strain produced with 0.8 percent C, and low strain produced with 0.1 percent C.

Figure 2C:
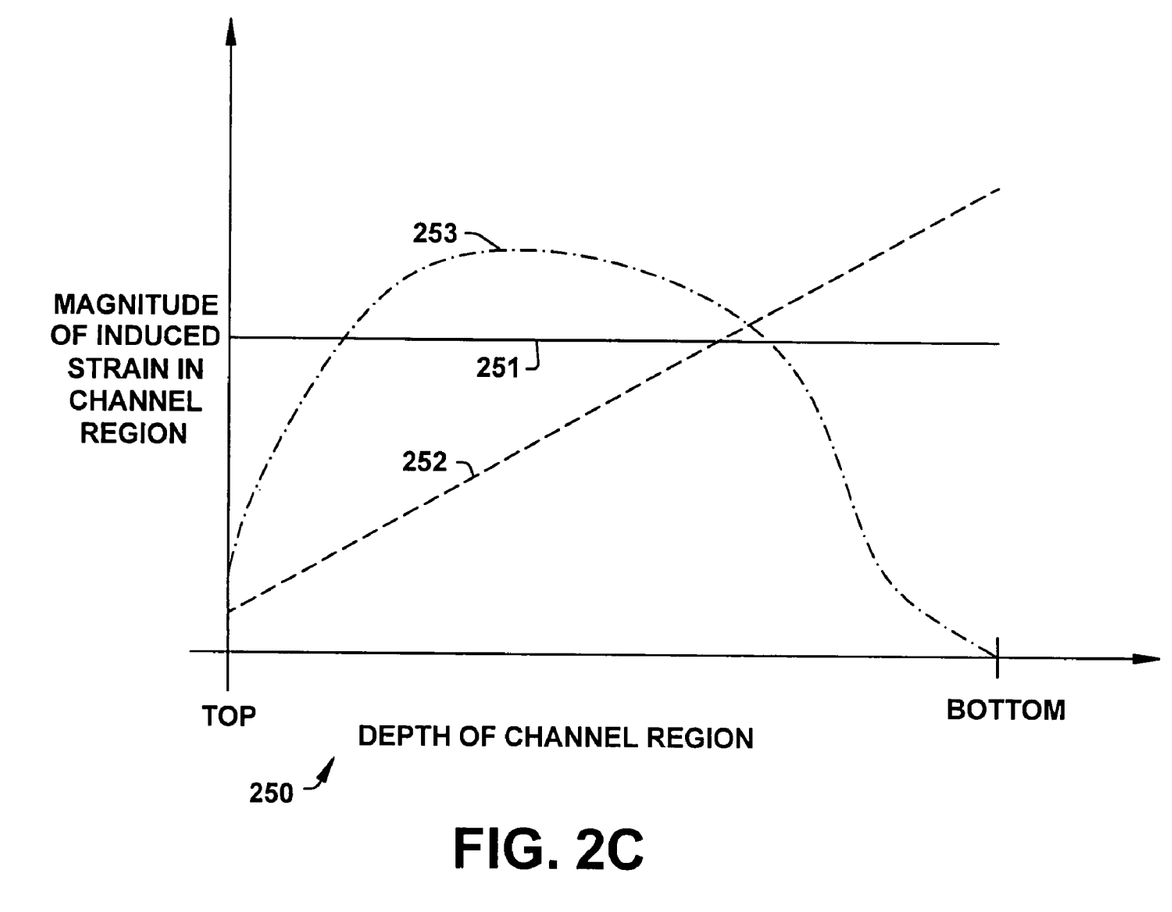
FIG. 2C is a graph illustrating exemplary channel strain profiles in accordance with an aspect of the present invention.

FIG. 2C is a graph 250 illustrating exemplary channel strain profiles in accordance with an aspect of the present invention. The exemplary strain profiles can be employed as the strain profile 240 of FIG. 2B and other aspects of the invention. The graph 250 is provided to further illustrate tailored channel strain profiles of the present invention by illustrating depth (in the channel) versus magnitude of strain.

The graph 250 of FIG. 2C depicts an amount of induced strain in the channel along a y-axis and distance from a top or surface of a channel region through a central portion of the channel region, and finally down to the bottom of the channel. The top or surface of the channel region corresponds with a top or surface of the composition controlled recess structures, such as the structure 224 of FIG. 2B. Line 251 depicts a substantially constant strain profile, which is not feasibly attained by conventional techniques. The constant strain profile 251 can be obtained by the present invention by altering the composition of the recess structures to account for the shape and dimension of the recess structures. Line 252 depicts a linearly changing channel strain profile, which can generally be obtained by linearly adjusting concentration of one or more components of material comprising recess structures at various depths during formation thereof. It is noted that since the recess shape is not perfectly vertical, a somewhat non-linear composition variation may be required to obtain the resultant linear strain profile. Line 253 illustrates a non-linearly changing channel strain profile, which can be obtained by non-linearly adjusting concentration of one or more components of material comprising recess structures during formation thereof.

The channel strain profiles 251, 252, and 253 are exemplary in nature and are not intended to limit the strain profiles that can be obtained in accordance with the present invention. Thus, it is appreciated that other tailored profiles can be obtained by controlling and/or adjusting composition of strain inducing materials employed in recess structures.

Figure 3:
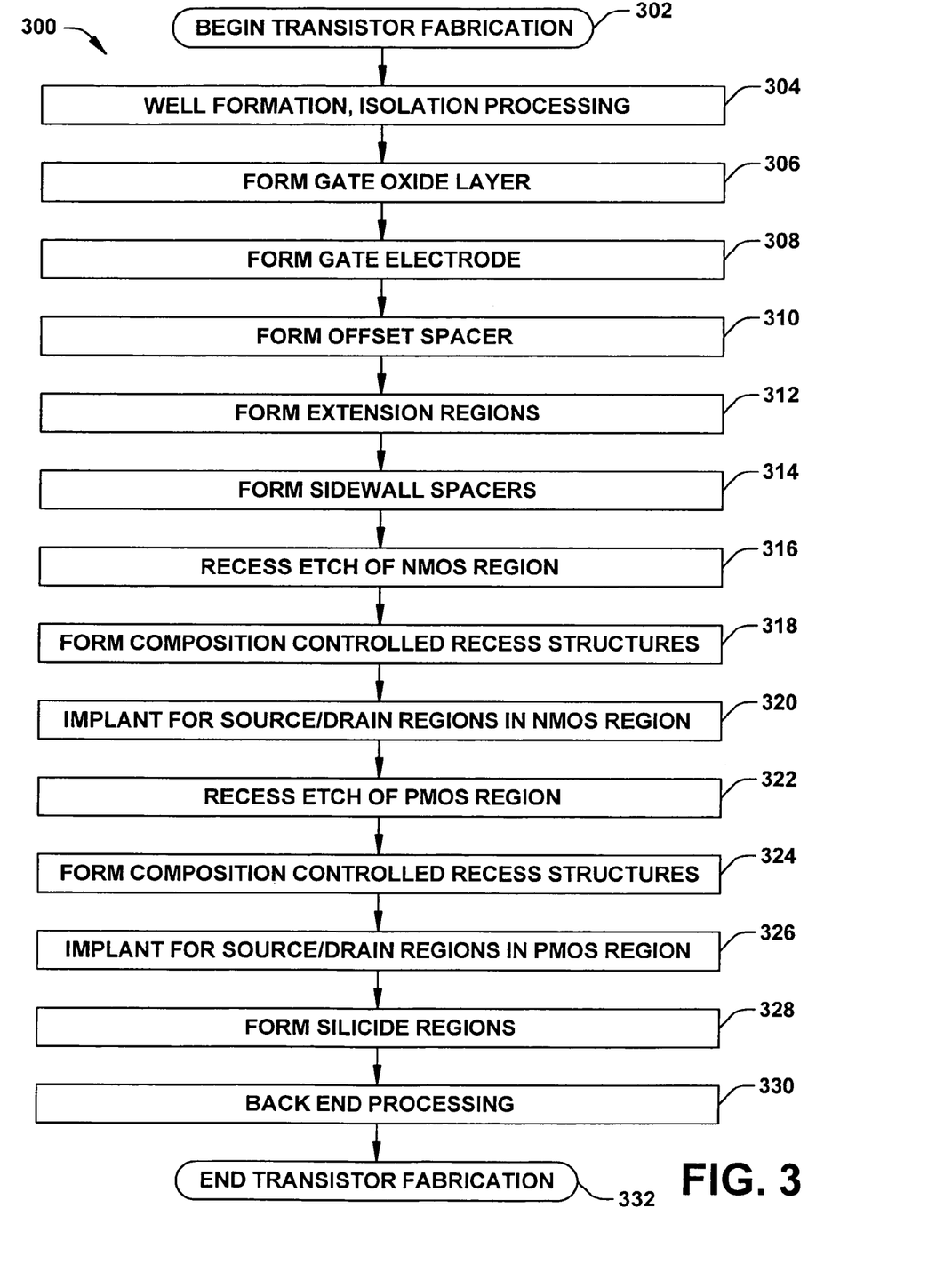
FIG. 3 is a flow diagram illustrating a method of fabricating a semiconductor device wherein tailored channel strain profiles are applied to NMOS and PMOS regions in accordance with an aspect of the present invention.

FIG. 3 is a flow diagram illustrating a method 300 of fabricating a semiconductor device wherein tailored channel strain profiles are applied to NMOS and PMOS regions in accordance with an aspect of the present invention. While the exemplary method 300 is illustrated and described below as a series of acts or events, it is appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement the method 300 in accordance with the present invention. Furthermore, the method 300 according to the present invention may be implemented in association with the fabrication of ICs and composite transistors illustrated and described herein, as well as in association with other transistors and structures not illustrated, including but not limited to NMOS and/or PMOS composite transistors.

The method 300 begins at 302, wherein transistor fabrication is initiated, and transistor well formation and isolation processing is performed at 304 thereby defining NMOS and PMOS regions, wherein NMOS regions comprise a P-well in which n-type source/drain regions will later be formed, and PMOS regions comprise an N-well in which p-type source/drain regions will later be formed, respectively. In addition, isolation regions may comprise shallow trench isolation (STI) or field oxide regions (LOCOS) that serve to define various active areas and electrically isolate various active areas laterally from one another.

The method 300 continues at 306, wherein a gate oxide layer is formed in active areas defined by the various formed isolation regions. In one example, the gate oxide comprises a thin, thermally grown silicon dioxide layer, however, other type gate dielectrics (such as high-k dielectrics) may be formed and are contemplated by the present invention. A conductive gate layer is then deposited over the gate oxide at 308 and patterned to form a conductive gate electrode. For example, a polysilicon layer may be deposited via chemical vapor deposition (CVD) and patterned via etching to form gate electrodes in both NMOS and PMOS regions, respectively.

An offset spacer is then formed on lateral edges of the conductive gate electrodes at 310. For example, a thin offset layer (e.g., an oxide or nitride layer) is formed generally conformally over the patterned gate and then etched using a generally anisotropic dry etch to remove offset layer material on top of the gate and in the source/drain regions, leaving a thin offset spacer material on lateral edges of the gate.

An extension region implant is then performed at 312 to form extension regions, wherein dopants are introduced into active regions of the device. The active regions are located within the semiconductor substrate and outside of the gate structures. In an exemplary extension region formation process, lightly doped, medium doped or heavily doped extension region implants are performed in the NMOS and PMOS regions, respectively, wherein the gate structure serves to self-align the extension regions. A thermal process such as a rapid thermal anneal can then be employed to activate the extension region dopants, which causes the extension regions to diffuse laterally slightly underneath the offset spacer toward the channels.

Still referring to FIG. 3, sidewall spacers are then formed on the gate structures at 314. The sidewall spacers comprise an insulating material such as an oxide, a nitride or a combination of such layers. The spacers are formed by depositing a layer of such spacer material(s) over the device in a generally conformal manner, followed by an anisotropic etch thereof, thereby removing such spacer material from the top of the gate structure and from the moat or active area and leaving a region on the lateral edges of the gate structure, overlying the offset spacers. The sidewall spacers are substantially thicker than the offset spacers, thereby resulting in the subsequently formed source/drain regions to be offset from lateral edges of the gate.

Continuing with the method 300, an NMOS recess etch is performed at block 316 that removes a surface portion of semiconductor material from the semiconductor substrate and forms recessed regions having a selected thickness and/or depth. A mask is typically employed to cover the PMOS region and expose the NMOS region. In one example, the recessed regions are formed using a dry etching process such as the chemistry employed to etch STI trenches in the semiconductor body when forming isolation regions. The recessed regions, in another example extend into the semiconductor substrate to a depth of about 30 nm to about 70 nm. However, it is appreciated that other suitable depths can be employed. In the present example, the gate structure is not masked during the recess formation; therefore if the gate electrode is composed of polysilicon, the recess formation process will also result in a recess formed in a top portion of the gate electrode material. Alternately, the gate electrode can be masked in order to avoid etching the gate electrode during recess formation.

The method 300 then continues at 318, wherein composition controlled filled recess structures comprised of a tensile strain producing material, such as silicon-carbon, are formed in the NMOS recessed regions. In one example, silicon-carbon is formed via a selective epitaxial deposition process such as an LPCVD (low pressure chemical vapor deposition) process. By using a carbon-containing gas source (e.g., C2H4) as an additional source gas, the silicon material formed in the recesses is doped with carbon in-situ. The flow of the source gases can be controlled during the deposition or formation to alter the composition of the silicon-carbon. The silicon-carbon within the recesses form an alloy that has a lattice with the same structure as the silicon body lattice, however, the silicon-carbon alloy has a smaller spacing. Consequently, the silicon-carbon within the recesses will tend to contract, thereby creating a tensile stress within the channel of the semiconductor substrate.

Source/drain regions are then formed in the NMOS region by implanting n-type dopants (e.g., arsenic and/or phosphorous) at 320. The source/drain dopant is introduced into the exposed areas (top of gate electrode and active areas not covered by the sidewall spacers). Alternately, source/drain dopants can be incorporated during the formation of the filled recess structures.

A PMOS recess etch is performed at block 322 that removes a surface portion of semiconductor material from the semiconductor substrate and forms recessed regions having a selected thickness and/or depth. A mask is typically employed to cover the NMOS region and expose the PMOS region. In one example, the recessed regions are formed using a dry etching process such as the chemistry employed to etch STI trenches in the semiconductor body when forming isolation regions, as stated above. Some exemplary depths for the recessed region include about 30 nm to about 70 nm, however other suitable depths can be employed.

The method 300 then continues at 324, wherein composition controlled filled recess structures comprised of a compressive strain producing material, such as silicon-germanium, are formed in the PMOS recessed regions via techniques such as chemical vapor deposition (CVD) or molecular beam epitaxy (MBE), and the like. Sources for silicon and germanium (either gas or solid, technique dependent) are employed to control the composition of the filled recess structures. The flow of the source gases can be controlled to alter the composition of the strain producing material. Additionally, the formed structures are typically thicker than the recessed regions in order to mitigate damage from later removal.

Source/drain regions are then formed in the PMOS region by implanting n-type dopants (e.g., boron) at block 326. The source/drain dopant is introduced into the exposed areas (top of gate electrode and active areas not covered by the sidewall spacers). Alternately, source/drain dopants can be implanted during the formation of the filled recess structures. Subsequently, the mask can be removed and a thermal process can then be performed to activate dopants within the source/drain regions of both the NMOS and PMOS regions.

Subsequently, silicide processing is performed at block 328, wherein a refractory metal material is formed over the device, followed by a thermal process, wherein the metal and silicon interfaces react to form a silicide (on top of the gate and in the source/drain regions). Unreacted metal is then stripped away, and back end processing such as interlayer dielectric and metallization layers are formed at 330 to conclude the device formation at 332.

Figure 4A:
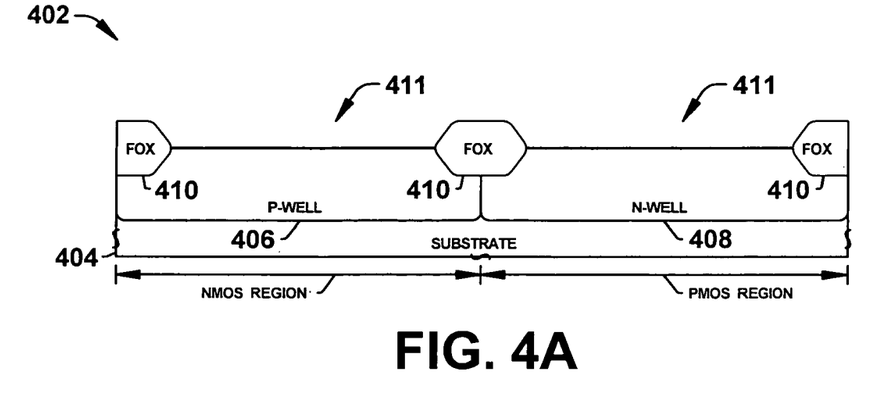
FIGS. 4A-4N are a plurality of fragmentary cross section diagrams illustrating a transistor device being formed in accordance with an aspect of the present invention.
Figure 4B:
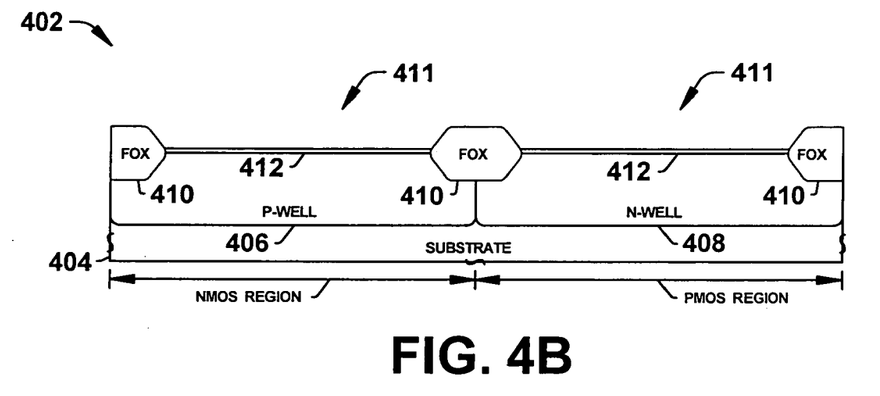
Figure 4C:
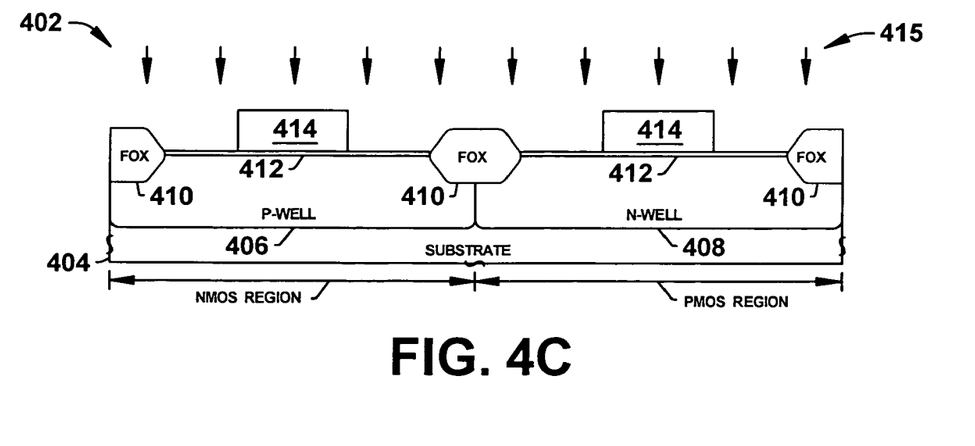
Figure 4D:
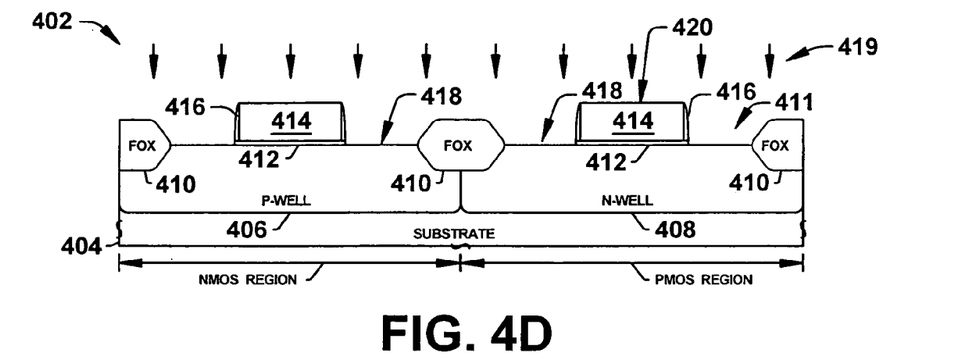
Figure 4E:
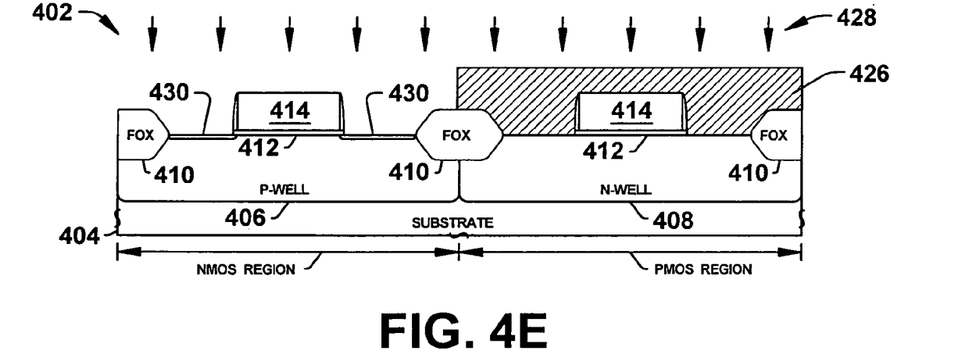
Figure 4F:
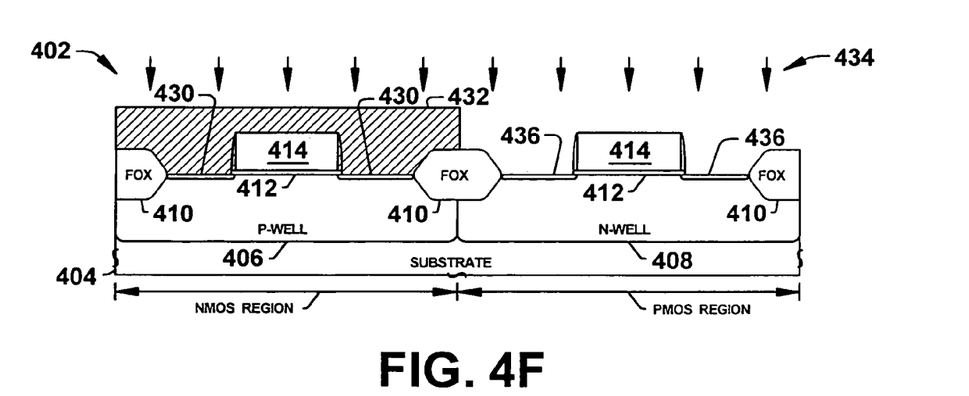
Figure 4G:
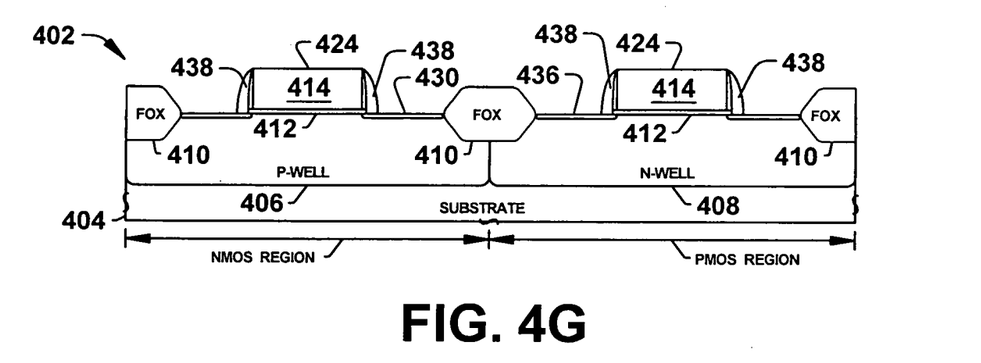
Figure 4H:
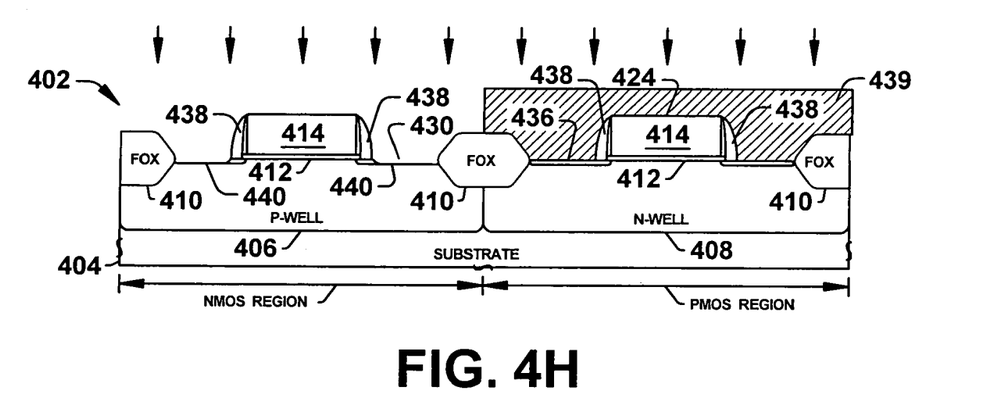
Figure 4I:
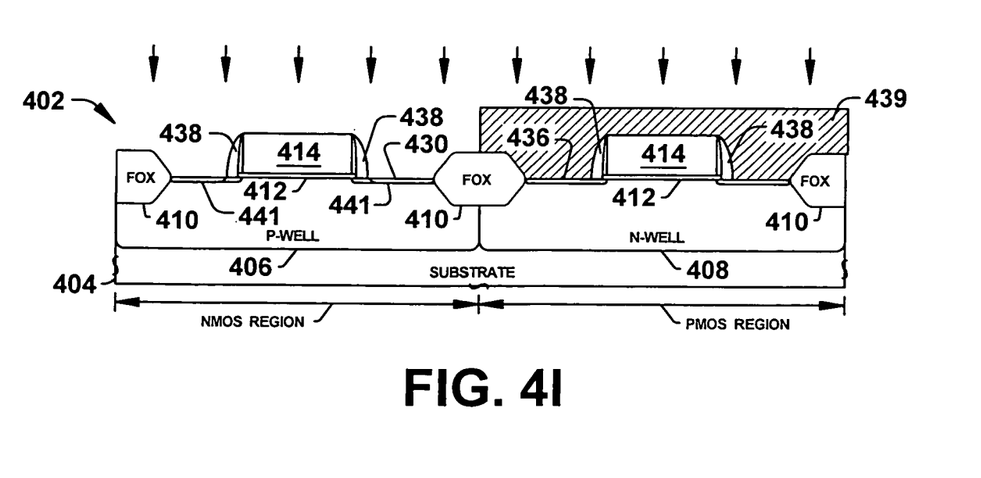
Figure 4J:
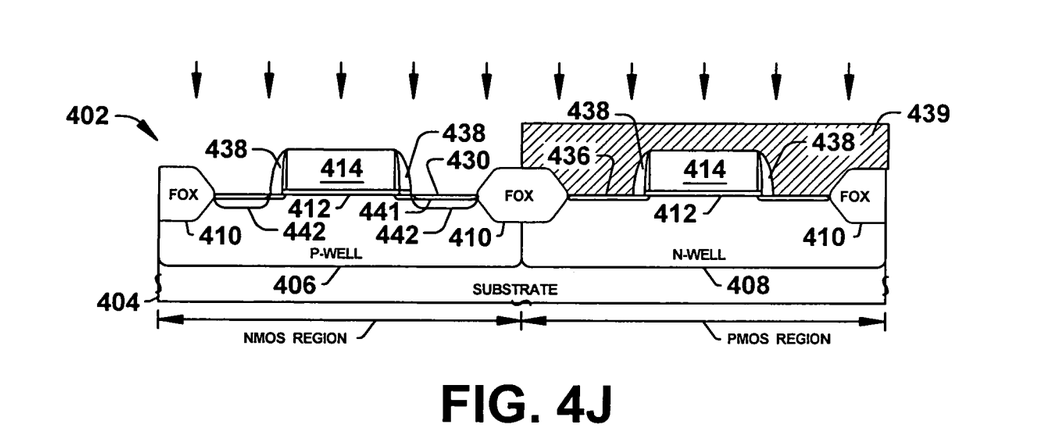
Figure 4K:
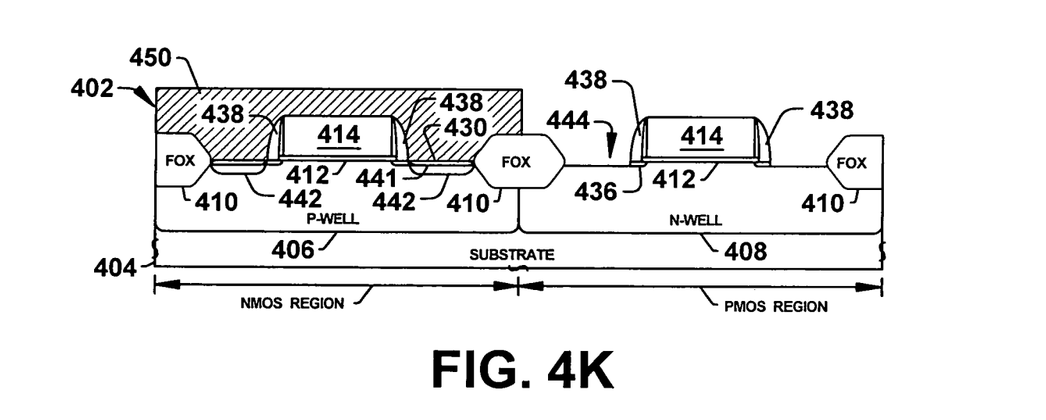
Figure 4L:
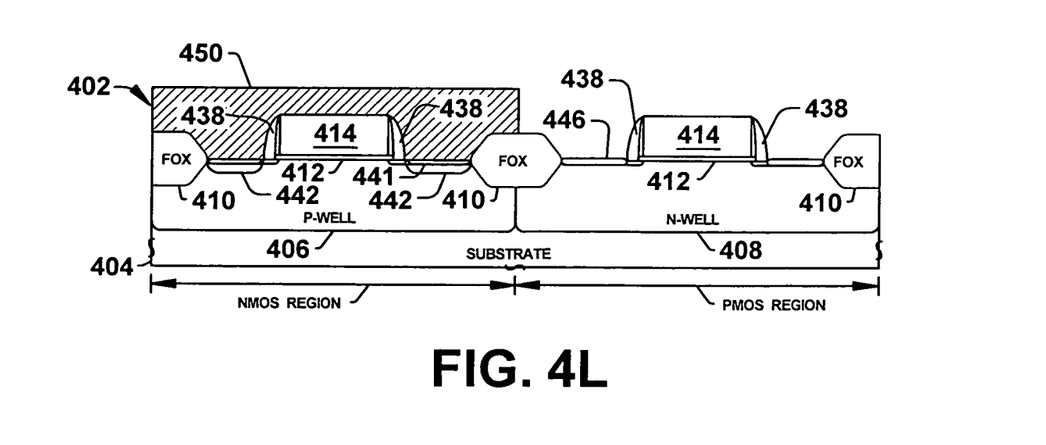
Figure 4M:
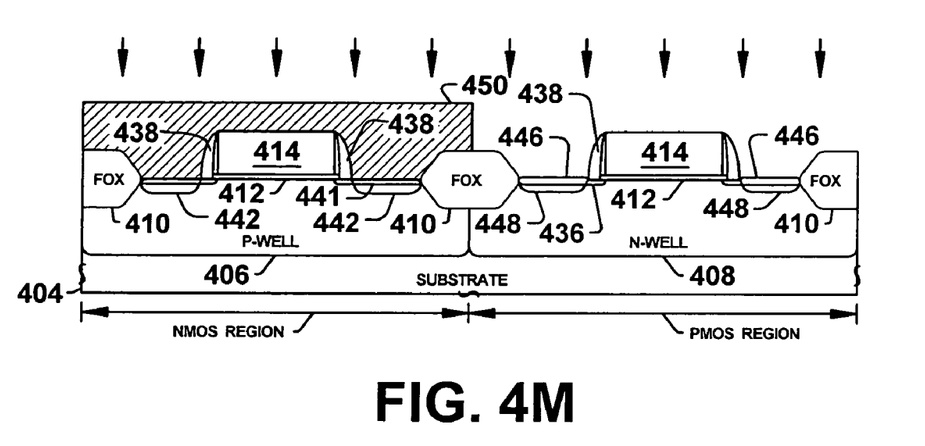
Figure 4N:
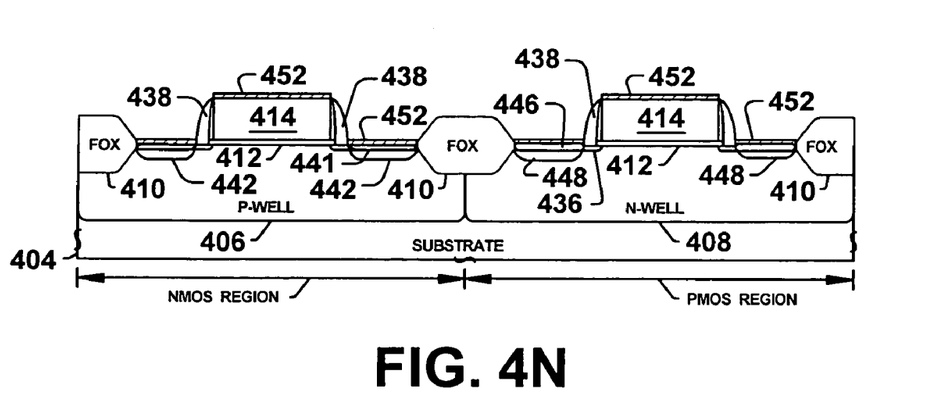

Turning now to FIGS. 4A-4N, a plurality of fragmentary cross section diagrams illustrating a transistor device being formed in accordance with the present invention of the method 300 of FIG. 3 is provided. In FIG. 4A, a transistor device 402 is provided, wherein a semiconductor body 404, such as a semiconductor substrate, has a number of wells formed therein, such as a P-well 406 to define an NMOS transistor device region and an N-well 408 to define a PMOS transistor device region, respectively. Further, isolation regions 410 such as STI regions are formed in the semiconductor body to define active area regions 411, as may be appreciated. In FIG. 4B, the transistor device 402 is illustrated, wherein a gate oxide 412 has been formed, for example, by thermally grown $SiO_2$, over the active regions 411.

Referring to FIG. 4C, a conductive gate electrode material (e.g., polysilicon) has been deposited and patterned via an etching process 415 to form a gate electrode 414 overlying the gate oxide 412. Turning now to FIG. 4D, offset spacers 416 are then formed on the lateral edges of the gate electrode. The offset spacers are typically comprised of an insulative material such as oxide.

The PMOS region is then masked, as illustrated in FIG. 4E with a masking material 426 such as photoresist, and an extension region implant 428 is performed to form n-type extension regions 430 in the exposed NMOS region.

The n-type extension region mask 426 is then removed, and a p-type extension region mask 432 is deposited and patterned to cover the NMOS region and expose the PMOS region, as illustrated in FIG. 4F. A p-type extension region implant process 434 is then performed to form p-type extension regions 436 in the PMOS region, as illustrated. The mask 432 is then removed and a thermal process such as a rapid thermal anneal can be performed to activate the dopants, wherein a lateral diffusion of the extension regions 430 and 436 under the offset spacers 416 can be achieved.

Sidewall spacers are then formed over the offset spacers 416 on the lateral edges of the gate structures. An insulating sidewall material is deposited in a generally conformal manner over the device and subsequently subjected to an anisotropic etch to remove the insulating material on top of the gate and over the active areas, leaving sidewall spacers 438 in both the NMOS and PMOS regions, as illustrated in FIG. 4G.

The PMOS region is again covered with a mask 439 comprised of a suitable masking material (e.g., photoresist). A recess etch is performed that removes a selected amount of material from a surface portion of the active regions thereby forming recessed regions 440 within the NMOS region. FIG. 4H depicts the semiconductor device after formation of the recessed region 440.

Composition controlled filled recess structures 441 comprised of a tensile strain producing material, such as silicon-carbon, are formed in the NMOS recessed regions as illustrated in FIG. 4I. The composition of the filled recess structures 441 is controlled and can vary in composition from bottom to top of the structures 441. As a result, the resulting tensile strain can be increased or decreased by correspondingly increasing or decreasing one or more components of the tensile strain producing material. Thus, a vertical strain profile, as described in FIG. 2B can be obtained.

In one example, silicon-carbon is employed as the tensile strain producing material and is formed via a selective epitaxial deposition process such as an LPCVD (low pressure chemical vapor deposition) process. Source gases can be controlled to alter the composition of the tensile strain producing material, such as silicon-carbon, thereby altering the strain produced.

Source and drain regions 442 are formed in the NMOS region by implanting a suitable n-type dopant as depicted in FIG. 4J. The implant is performed with the mask 439 to selectively implant the NMOS region with an n-type dopant. As can be seen in FIG. 4J, the source/drain regions 440 are self-aligned with respect to the sidewall spacers 438, and thus are laterally spaced from the extension regions 430.

The NMOS region is covered with a mask 450 comprised of a suitable masking material (e.g., photoresist) and a recess etch is performed that removes a selected amount of material from a surface portion of the active regions thereby forming recessed regions 444 within the PMOS region. FIG. 4K depicts the semiconductor device after formation of the recessed regions 444.

Composition controlled filled recess structures 446 comprised of a compressive strain producing material, such as silicon-germanium, are formed in the PMOS recessed regions as illustrated in FIG. 4L. The composition of the filled recess structures 446 is controlled and can vary in composition vertically from bottom to top of the structures 446. As a result, the resulting compressive strain can be increased or decreased by correspondingly increasing or decreasing one or more components of the tensile strain producing material. Thus, a vertical strain profile, as described in FIG. 2B can be obtained.

A suitable formation process includes an epitaxial formation process that utilizes bottom surfaces of the recessed active regions as a seed for the growth process, such as, chemical vapor deposition (CVD) and/or molecular beam epitaxy (MBE), and the like. Source gases for silicon and germanium are employed to control the composition of the filled recess structures.

Source and drain regions 448 are formed in the PMOS region by implanting a suitable p-type dopant as depicted in FIG. 4M. The implant is performed with the mask 450 to selectively implant the PMOS region with a p-type dopant. As can be seen in FIG. 4M, the source/drain regions 448 are self-aligned with respect to the sidewall spacers 438, and thus are laterally spaced from the extension regions 436. A thermal process, such as an activation anneal, is typically performed to activate the implanted dopants and diffuse the implanted dopants.

Continuing, silicide regions 452 are formed on active regions and gate electrodes 414 by a suitable silicidation process. FIG. 4N depicts the semiconductor device after formation of the suicide regions. Typically, silicide regions are formed by depositing a refractory metal (e.g., nickel, cobalt, titanium, alloys thereof, and the like) over the device and inducing (e.g., by annealing) the deposited refractory metal to react with underlying silicon forming silicide regions that reduce contact resistance between active regions and electrodes with contacts, interconnects, and the like. Un-reacted refractory metal is then removed. Subsequently, back end processing including metallization may be performed to interconnect the various transistors, as may be desired.

While, for purposes of simplicity of explanation, the methodologies of FIGS. 1 and 3 are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating a semiconductor device comprising:
   selecting a channel strain profile for channel regions of the semiconductor device;
   performing a recess etch in active regions of the semiconductor device to form recessed regions having a depth according to the selected channel strain profile; and
   forming composition controlled recess structures within the recessed regions according to the selected channel strain profile, wherein the composition controlled recess structures comprise a strain inducing material, defined by a single selectively adjusted deposition process from a bottom of the recessed region to a top of the recessed region.

2. The method of claim 1, wherein selecting the channel strain profile comprises selecting the channel strain profile according to a desired channel mobility.

3. The method of claim 1, wherein selecting the channel strain profile comprises selecting strain type and magnitude at various depths of the channel region.

4. The method of claim 1, wherein the selected channel strain profile is substantially constant through depths of the channel regions.

5. The method of claim 1, wherein the selected channel strain profile varies linearly in magnitude through depths of the channel regions.

6. The method of claim 1, wherein the selected channel strain profile varies non-linearly in magnitude through depths of the channel regions.

7. The method of claim 1, wherein forming the composition controlled recess structures comprises depositing the strain inducing material while varying one or more source components of the strain inducing material according to the selected channel strain profile.

8. The method of claim 1, wherein forming the composition controlled recess structures comprises employing silicon-germanium as the strain inducing material.

9. A method of fabricating a semiconductor device comprising:
   performing well formation and isolation processing in a semiconductor body;
   forming a gate oxide layer on the semiconductor body;
   forming gate electrodes on the gate oxide layer;
   forming offset spacers on lateral edges of the gate electrodes;
   forming extension regions in the semiconductor body in NMOS and PMOS regions;
   forming sidewall spacers adjacent the offset spacers;
   performing a recess etch of active regions within the NMOS region to form recessed regions within the NMOS region;
   forming composition controlled recess structures within the recessed regions of the NMOS region by forming tensile strain inducing material within the recessed regions while varying one or more components of the tensile strain inducing material to obtain a tailored tensile channel strain profile;
   performing a recess etch of active regions within the PMOS region to form recessed regions within the PMOS region; and
   forming composition controlled recess structures within the recessed regions of the PMOS region by forming compressive strain inducing material within the recessed regions while varying one or more components of the compressive strain inducing material to obtain a tailored compressive channel strain profile,
   each strain inducing material defined by a single selectively adjusted deposition process from a bottom of the recessed region to a top of the recessed region.

10. The method of claim 9, further comprising forming silicide regions on the source/drain regions and gate electrodes in the PMOS and NMOS regions.

11. The method of claim 9, further comprising implanting an n-type dopant into the formed recess structures of the NMOS region to form source/drain regions.

12. The method of claim 9, further comprising implanting a p-type dopant into the formed recess structures of the PMOS region to form source/drain regions.

13. The method of claim 9, further comprising doping the recess structures of the NMOS/PMOS region with an n-type/p-type dopant while forming the recess structures to form source/drain regions.

14. The method of claim 13, further comprising performing a thermal process to activate the n-type dopants and further form the source/drain regions.

15. The method of claim 9, wherein the tailored tensile channel strain profile is substantially constant.

16. The method of claim 15, wherein the tailored compressive channel strain profile is non-linear.

17. A method of forming a composition controlled recess structure comprising:

performing a recess etch of active regions of a semiconductor device to a depth selected according to a channel strain profile forming recessed regions;

selecting an initial concentration of one or more components of a strain inducing material according to a bottom of the channel strain profile;

selecting a final concentration of the one or more components of the strain inducing material according to a top of the channel strain profile; and forming the composition controlled recess structure within the recessed regions by initially forming the strain inducing material according to the initial concentration and finally forming the strain inducing material according to the final concentration, each of the recessed structures defined by a single selectively adjusted deposition process from a bottom of the recessed region to a top of the recessed region.

18. The method of claim 17, wherein forming the composition controlled recess structure further comprises tailoring the concentration of the one or more components of the strain inducing material according to the channel strain profile.

19. The method of claim 17, wherein the initial concentration is varied from the final concentration and induced strain resulting is equal.

20. The method of claim 17, wherein the channel strain profile varies linearly from a first strain magnitude to a second strain magnitude.

* * * * *